United States Patent [19]

Khanna

[11] Patent Number: 4,737,737

[45] Date of Patent: Apr. 12, 1988

[54] TRANSMISSION INJECTION-LOCKED DIELECTRIC RESONATOR OSCILLATOR

[75] Inventor: Amarpal S. Khanna, Sunnyvale, Calif.

[73] Assignee: Avantek, Inc., Santa Clara, Calif.

[21] Appl. No.: 888,565

[22] Filed: Jul. 22, 1986

[51] Int. Cl.[4] .............................................. H03B 5/18
[52] U.S. Cl. ........................................ 331/47; 331/55; 331/76; 331/96; 331/117 D; 331/172; 333/247
[58] Field of Search ........................ 331/47, 50, 52–55, 331/76, 96, 99, 107 DP, 107 SL, 117 D, 172; 333/204, 247, 250

[56] References Cited

U.S. PATENT DOCUMENTS 4,219,779  8/1980  Shinkawa et al. ......... 331/117 D X
4,630,004 12/1986  Neihenke et al. .......... 331/117 D X

FOREIGN PATENT DOCUMENTS 0156002 12/1981 Japan ..................................... 331/96
0097207  6/1982 Japan ..................................... 331/96

Primary Examiner—Eugene R. LaRoche
Assistant Examiner—David Mis
Attorney, Agent, or Firm—Limbach, Limbach & Sutton

[57] ABSTRACT

A dielectric resonator oscillator utilizing transmission-type injection-locking for frequency stabilization is disclosed as including a transistor, two microstrip lines, and a dielectric resonator. One microstrip line is coupled to the transistor, while the other microstrip line receives the broadband signal. The dielectric resonator is positioned adjacent to and between the first and second microstrip lines and is operable for coupling an injection-locking signal into the transistor for locking the oscillation frequency of the oscillator. The two microstrip lines are preferably oriented at right angles so that various sizes of the dielectric resonator can be accommodated.

11 Claims, 1 Drawing Sheet

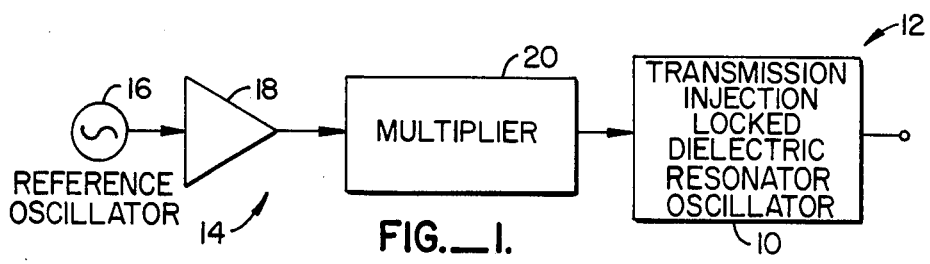
FIG._1.
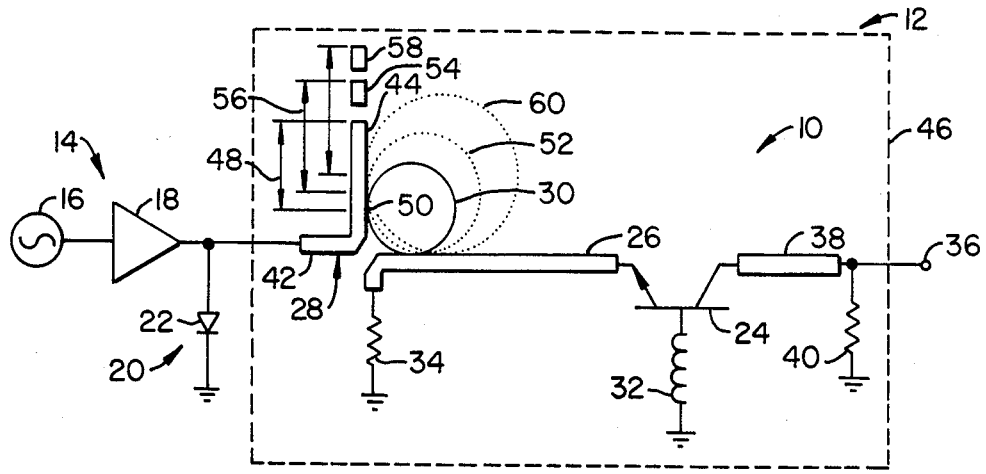
FIG._2.
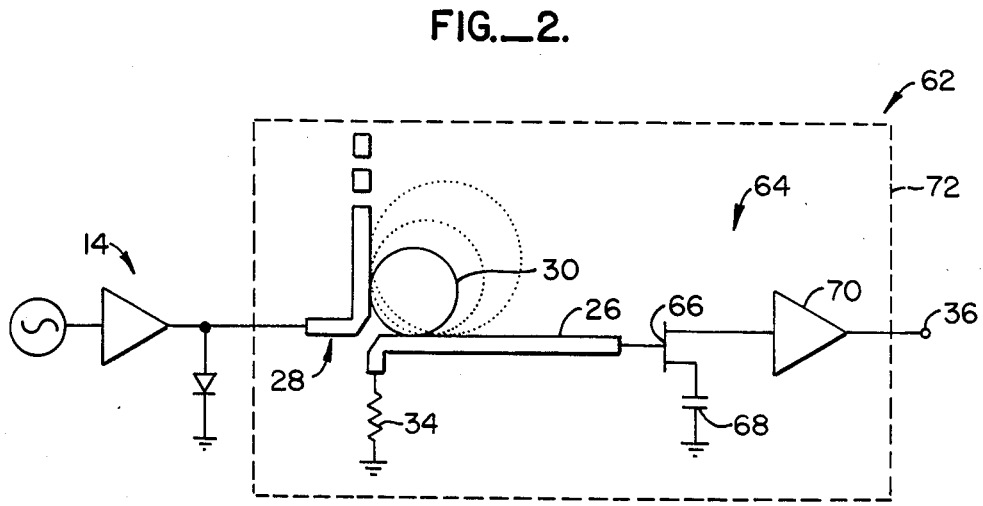
FIG._3.

TRANSMISSION INJECTION-LOCKED DIELECTRIC RESONATOR OSCILLATOR

BACKGROUND OF THE INVENTION

1. Field of the Invention

This invention relates generally to dielectric resonator oscillators for generating microwave energy, and relates more particularly to a dielectric resonator oscillator utilizing transmission-type injection-locking for frequency stabilization.

2. Description of the Relevant Art

Injection-locking is a well known technique for stabilizing the oscillation frequency of an oscillator by locking it to the frequency of an injection-locking signal. The injection-locking signal is typically a harmonic of a low-frequency reference signal that has a stable frequency and high spectral purity, such as the output signal from a crystal oscillator. The injection-locking signal may be generated, for example, by first generating the reference signal, and then amplifying and multiplying the reference signal to generate its harmonics, and then filtering to remove all of the harmonics except for the harmonic at the desired frequency of the injection-locking signal. The injection-locking signal is then supplied to the oscillator for frequency stabilization.

In order for the injection-locking to work properly, the injection-locking bandwidth of the oscillator must be greater than the frequency drift of the oscillator over varying operating conditions of temperature, load, bias, and time. This typically involves a trade-off between the power of the injection-locking signal and the stability of the oscillator, with increasing power of the injection-locking signal needed to compensate for increasing drift of the oscillator.

Two types of injection-locking, reflection-locking and transmission locking, are distinguished by the point at which the injection-locking signal is injected into the oscillator. Reflection injection-locking involves the injection of the locking signal into the output port of the oscillator through a circulator. The circulator is needed in order to isolate the output signal of the oscillator and the injection-locking signal. Unfortunately, the use of the circulator introduces losses into the signal path of the oscillator and complicates the task of packaging because any output amplifier must be placed downstream from the circulator, instead of on the same substrate as the oscillator. Transmission injection-locking involves the injection of the locking signal into a port of the oscillator apart from the output port, thus requiring separate signal-input and power-output ports, but eliminating the need for a circulator.

SUMMARY OF THE INVENTION

In accordance with the illustrated preferred embodiment, the present invention provides a dielectric resonator oscillator utilizing transmission-type injection-locking for frequency stabilization. The injection-locking signal is one component of a broadband signal that contains harmonics of a stable reference signal. The oscillator includes a transistor, first and second microstrip lines, and a dielectric resonator. The transistor is operable for oscillation and has a first terminal coupled to an output port. The first microstrip line is coupled to a second terminal of the transistor, while the second microstrip line is separated from the first microstrip line and is operable for receiving the broadband signal. The dielectric resonator is positioned adjacent to and between the first and second microstrip lines and is operable for coupling the injection-locking signal component of the broadband signal to the transistor for locking the oscillation frequency of the oscillator.

The resonant frequency of the dielectric resonator determines which of the harmonic frequencies of the broadband signal is coupled into the transistor for locking the oscillations thereof. Since the size of the dielectric resonator determines its resonant frequency, the size of the dielectric resonator determines which harmonic component of the broadband signal is injected into the oscillator.

Preferably, the first and second microstrip lines extend perpendicular to each other in a quadrature orientation. Such an orientation can accommodate a range of sizes for the dielectric resonator, which advantageously permits the same substrate layout to be utilized for building oscillators that operate over a range of frequencies.

The dielectric resonator accomplishes three tasks in the frequency stabilized oscillator of the present invention. First, the dielectric resonator determines the inherent oscillation frequency of the oscillator in the absence of the injection-locking signal. Second, the dielectric resonator provides a signal-input port for the injection of the locking signal into the oscillator. Third, the dielectric resonator provides a band-pass filter that allows only the proper frequency component of the broadband signal to couple into the oscillator, thus eliminating the need for a separate filter between the source of the injection-locking signal and the injection-locked oscillator.

One important feature of the oscillator of the present invention is that it utilizes transmission injection-locking, rather than reflection injection-locking. By utilizing transmission injection-locking, the present invention simplifies the circuitry of an injection-locked oscillator by eliminating the need for a circulator. By eliminating the circulator, an amplifier can be packaged on the same substrate as the oscillator, thus providing a packaging, as well as a cost, advantage over reflection-type injection-locked oscillators. Another advantage of the present invention over reflection-locked oscillators is that, due to improved gain, a less powerful injection-locking signal is required for locking the oscillator. Another feature is that either bipolar or field-effect transistors can be utilized as the active element in the oscillator of the present invention.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIG. 1 is a block diagram of a frequency stabilized microwave oscillator according to the present invention.

FIG. 2 is a schematic diagram of a frequency stabilized microwave oscillator, according to the present invention, that utilizes a bipolar transistor as its active element.

FIG. 3 is a schematic diagram of a frequency stabilized microwave oscillator, according to the present invention, that utilizes a field-effect transistor as its active element.

DETAILED DESCRIPTION OF THE PREFERRED EMBODIMENTS

FIGS. 1 through 3 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is a dielectric resonator oscillator 10 utilizing transmission-type injection-locking for frequency stabilization, as illustrated in FIG. 1. More broadly stated, the present invention concerns a frequency stabilized microwave oscillator 12, which includes the dielectric resonator oscillator 10 and an injection-locking signal generator 14. As shown, the injection-locking signal generator 14 preferably includes a reference oscillator 16, an amplifier 18, and a multiplier 20. The reference oscillator 16 generates a reference signal having a high spectral purity at a stable frequency, while the multiplier 20 generates a broadband signal containing harmonics of the reference signal. One harmonic component of the broadband signal, the injection-locking signal, is equal in frequency to the desired oscillation frequency of the oscillator 10. The reference oscillator 16 can be, for example, a crystal oscillator.

One preferred embodiment of the present invention is illustrated in FIG. 2. The multiplier 20 of the injection-locking signal generator 14 comprises a diode 22 coupled to ground. The dielectric resonator oscillator 10 includes an NPN bipolar transistor 24, first and second microstrip lines 26 and 28, and a dielectric resonator 30. The base of the transistor 24 is coupled to ground through an inductor 32, which provides the instability needed to initiate oscillation of the oscillator. The emitter of the transistor 24 is connected to one end of the first microstrip line 26, while the other end thereof is terminated to ground through its characteristic impedance 34. The collector of the transistor 24 is coupled to an output port 36 through a third microstrip line 38, which is terminated near the output port to ground through its characteristic impedance 40.

The second microstrip line 28 provides a path for the injection-locking signal to be coupled through the dielectric resonator 30 into the oscillator 10. The second microstrip line 28 is preferably L-shaped, with one leg 42 coupled to the injection-locking signal generator 14 and with the other leg 44 extending at right angles to the first microstrip line 26. As shown in FIG. 2, the dielectric resonator 30 is positioned adjacent to and between the first microstrip line 26 and the second leg 44 of the second microstrip line 28, at an optimum separation distance between the dielectric resonator and each microstrip line. Preferably, the transistor 24, microstrip lines 26, 28, and 38, and dielectric resonator 30 are all mounted on or otherwise coupled to the same substrate 46. The dielectric resonator oscillator 10 is powered by an applied DC voltage (not shown).

In operation without locking signal injection, the dielectric resonator oscillator 10 oscillates according to a frequency determined by the resonant frequency of the dielectric resonator 30. In operation with locking signal injection, the oscillator 10 locks onto the frequency of the injection-locking signal. The injection-locking signal generator 14 supplies to the second microstrip line 28 the broadband signal containing the harmonics of the reference signal generated by the reference oscillator 16. The dielectric resonator 30 couples from the second microstrip line 28 to the first microstrip line 26 only that component of the broadband signal that is fairly close in frequency to the resonant frequency of the dielectric resonator. Thus, the dielectric resonator 30 acts as a band-pass filter to couple into the oscillator 10 only the injection-locking signal, which has a frequency close to the resonant frequency of the dielectric resonator 30. Even if the resonant frequency of the dielectric resonator 30 drifts somewhat due to temperature or other factors, the same injection-locking signal will be coupled into the oscillator for frequency stabilization, assuming that the injection-locking signal is sufficiently powerful.

The orientation of the two microstrip lines 26 and 28 advantageously permits the use of different sizes for the dielectric resonator 30 in order to fabricate oscillators of different frequency using the same substrate 46. In order to provide the maximum coupling between a dielectric resonator and a microstrip line, the dielectric resonator should be positioned adjacent to the microstrip line at a point where the magnetic field is at a maximum and the electric field is at a minimum. If the microstrip line is terminated with an open circuit, such as a stub end, the proper coupling position for the dielectric resonator is a quarter wavelength back from the stub end. Accordingly, in FIG. 2, the second leg 44 of the second microstrip line 28 is terminated at a distance 48 from the coupling point 50 that is substantially equal to one quarter of the wavelength of the nominal resonant frequency of the dielectric resonator 30. In order to accommodate the different wavelength and size of another dielectric resonator 52, the second leg 44 can be extended in length by electrically connecting a pad 54 to the end of the leg. The distance 56 from the end of the extended microstrip line to the coupling point of the dielectric resonator 52 is selected to be one quarter of the wavelength of the dielectric resonator 52. Note that the location of the coupling point is dependent upon the radius of the dielectric resonator. Additional pads 58 can be provided on the substrate 46 for accommodating additional sizes of dielectric resonators 60.

Another preferred embodiment of a frequency stabilized microwave oscillator 62, according to the present invention, is illustrated in FIG. 3. The portion of the frequency stabilized microwave oscillator 62 that comprises a transmission injection-locked dielectric resonator oscillator 64 includes a field-effect transistor 66 as its active element, rather than the bipolar transistor 24 of oscillator 10. Apart from the change of transistor type and other changes noted below, the circuitry of the oscillator 64 is substantially the same as that of oscillator 10.

Like transistor 24, transistor 66 receives the injection-locking signal through the second microstrip line 28, the dielectric resonator 30, and the first microstrip line 26, and drives the output port 36. The gate of the transistor 66 is coupled to the first microstrip line 26, while the source of the transistor is coupled to ground through a capacitor 68, which provides the instability needed to initiate oscillation. The drain of the transistor 66 is coupled to the output port 36 either directly, or through an optional amplifier 70. The amplifier 70 can be advantageously situated on the same substrate 72 as the remainder of the oscillator circuitry because, unlike reflection-type injection oscillators, the injection-locking signal for the oscillator 64 is injected through the dielectric resonator 30 instead of through the output port 36. Like oscillator 10, oscillator 64 locks onto the injection-locking signal that is coupled into the oscillator through the dielectric resonator 30.

A frequency stabilized microwave oscillator 12 has been constructed and tested at a frequency of 8.0 GHz and a power of 13 dBm. At injection signal powers of −10 dBm, −16 dBm, and −22 dBm, the injection-locked bandwidth has been measured at 10 MHz, 7 MHz, and 4 MHz, respectively.

From the above description, it will be apparent that the invention disclosed herein provides a novel and advantageous dielectric resonator oscillator utilizing transmission-type injection-locking for frequency stabilization. The foregoing discussion discloses and describes merely exemplary methods and embodiments of the present invention. As will be understood by those familiar with the art, the invention may be embodied in other specific forms without departing from the spirit or essential characteristics thereof. For example, the connections to the base and emitter of transistor 24 could be interchanged without fundamentally effecting the operation of the oscillator 10. Likewise, the connections to the gate and source of transistor 66 could also be interchanged. Further, an amplifier could be added to the output side of the oscillator 10 and situated on the substrate 46. Accordingly, the disclosure of the present invention is intended to be illustrative, but not limiting, of the scope of the invention, which is set forth in the following claims.

What is claimed is:

1. A transmission injection-locked dielectric resonator oscillator for generating microwave energy at a stabilized frequency, wherein said oscillator is operable for locking onto one harmonic frequency of a broadband signal containing the harmonics of a stable reference signal; said oscillator comprising:
    a transistor operable for oscillation and having a first terminal coupled to an output port;
    a first microstrip line coupled to a second terminal of said transistor;
    a second microstrip line separated from said first microstrip line and operable for receiving said broadband signal; and
    a dielectric resonator positioned adjacent to and between said first and second microstrip lines for coupling one component of said broadband signal to said transistor for locking the oscillation frequency of said oscillator, wherein the resonant frequency of said dielectric resonator determines which of said harmonic frequencies that is coupled into said transistor.

2. An oscillator as recited in claim 1 wherein said first and second microstrip lines are contained on the same substrate and are oriented in non-parallel directions, and wherein a variety of sizes of said dielectric resonator can be accommodated between said first and second microstrip lines by varying the placement of said dielectric resonator on said substrate.

3. An oscillator as recited in claim 2 wherein said first and second microstrip lines are oriented at substantially right angles.

4. An oscillator as recited in claim 2 further comprising means for adjusting the length of said second microstrip line according to the resonant frequency of whichever dielectric resonator is installed.

5. An oscillator as recited in claim 4 wherein said means for adjusting the length of said second microstrip line includes one or more pads separated from the end of said second microstrip line, wherein one or more of said pads can be electrically connected to the end of said second microstrip line during assembly of said oscillator so as to adjust the length of said second microstrip line to conform to the length required for proper coupling between said second microstrip line and said dielectric resonator.

6. An oscillator as recited in claim 1 further comprising an amplifier disposed between said transistor and said output port.

7. An oscillator as recited in claim 1 wherein said transistor comprises a bipolar transistor.

8. An oscillator as recited in claim 1 wherein said transistor comprises a field-effect transistor.

9. A microwave oscillator for generating microwave energy at a stabilized frequency, said apparatus comprising:
    a transistor operable for oscillation and having a first terminal coupled to an output port;
    a first microstrip line coupled to a second terminal of said transistor;
    a dielectric resonator positioned adjacent to said first microstrip line, wherein the resonant frequency of said dielectric resonator is approximately equal to the desired frequency of said microwave energy;
    a second microstrip line positioned adjacent to said dielectric resonator and separated from said first microstrip line; and
    means for generating an injection-locking signal and supplying said injection-locking signal to said second microstrip line, wherein said dielectric resonator couples said injection-locking signal from said second microstrip line to said first microstrip line, and wherein the oscillation frequency of said oscillator is determined by the frequency of said injection-locking signal.

10. An oscillator as recited in claim 9 wherein said injection-locking signal is a component of a broadband signal that contains a spectrum of signals including the harmonics of a stable reference signal, and wherein said dielectric resonator acts as a band-pass filter to couple only one of said harmonic frequencies of said broadband signal for locking the frequency of said oscillator to the desired frequency.

11. A frequency stabilized microwave oscillator comprising:
    a dielectric resonator oscillator that includes a transistor coupled at a first terminal thereof to an output port and operable for oscillation at a frequency determined by a feedback impedance connected to a second terminal thereof, and a dielectric resonator operatively coupled to said second terminal of said transistor through a first microstrip line for supplying said feedback impedance, wherein the resonant frequency of said dielectric resonator is approximately equal to the desired frequency of said oscillator;
    means for generating a broadband signal containing the harmonics of a stable reference signal, wherein one component of said broadband signal comprises an injection-locking signal having a frequency equal to the desired frequency of said oscillator; and means for coupling said injection-locking signal to said second terminal of said transistor, said means including said first microstrip line, said dielectric resonator, and a second microstrip line positioned adjacent to said dielectric resonator and positioned nonparallel to said first microstrip line, wherein said broadband signal is supplied to said second microstrip line, wherein said injection-locking signal is coupled from said second microstrip line through said dielectric resonator and said first microstrip line to said transistor, and wherein the oscillation of said dielectric resonator oscillator locks onto the frequency of said injection-locking signal.

* * * * *